United States Patent
Ando et al.

(10) Patent No.: US 10,580,703 B2
(45) Date of Patent: Mar. 3, 2020

(54) MULTIVALENT OXIDE CAP FOR MULTIPLE WORK FUNCTION GATE STACKS ON HIGH MOBILITY CHANNEL MATERIALS

(71) Applicant: International Business Machines Corporation, Armonk, NY (US)

(72) Inventors: Takashi Ando, Tuckahoe, NY (US); Choonghyun Lee, Rensselaer, NY (US); Jingyun Zhang, Albany, NY (US); Pouya Hashemi, White Plains, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/969,252

(22) Filed: May 2, 2018

(65) Prior Publication Data

US 2019/0341314 A1    Nov. 7, 2019

(51) Int. Cl.
| | |
|---|---|
| *H01L 21/28* | (2006.01) |
| *H01L 29/49* | (2006.01) |
| *H01L 21/8238* | (2006.01) |
| *H01L 29/78* | (2006.01) |
| *H01L 29/51* | (2006.01) |
| *H01L 27/092* | (2006.01) |

(52) U.S. Cl.
CPC .......... *H01L 21/823842* (2013.01); *H01L 21/28088* (2013.01); *H01L 21/823857* (2013.01); *H01L 27/0922* (2013.01); *H01L 29/4966* (2013.01); *H01L 29/517* (2013.01); *H01L 29/7848* (2013.01)

(58) Field of Classification Search
CPC ......... H01L 27/0922; H01L 21/823857; H01L 21/28088
See application file for complete search history.

(56) References Cited

U.S. PATENT DOCUMENTS

| | | | |
|---|---|---|---|
| 7,829,953 | B2 | 11/2010 | Jung et al. |
| 8,012,827 | B2 | 9/2011 | Yu et al. |
| 8,399,344 | B2 | 3/2013 | Pierreux et al. |
| 8,404,550 | B2 | 3/2013 | Scheiper et al. |
| 9,859,392 | B2 | 1/2018 | Lim et al. |
| 2015/0021698 | A1 | 1/2015 | Ando et al. |
| 2015/0021699 | A1 | 1/2015 | Ando et al. |

OTHER PUBLICATIONS

C-H. Lin et al., "High Performance 14nm SOI FinFET CMOS Technology with 0.0174μm2 embedded DRAM and 15 Levels of Cu Metallization", IBM Semiconductor Research and Development Center (SRDC), coopyright 2014 IEEE, 3 pages.
M. Kouda et al., "Charged defects reduction in gate insulator with multivalent materials", 2009 Symposium on VLSI Technology Digest of Technical Papers, 2 pages.

*Primary Examiner* — Elias Ullah
(74) *Attorney, Agent, or Firm* — Cantor Colburn LLP; Vazken Alexanian (57) ABSTRACT

A method of fabricating a semiconductor device includes providing a high-k dielectric layer arranged on a channel region including a first transistor area and a second transistor area. The method further includes depositing a multivalent oxide layer directly on the high-k dielectric layer of the first transistor area. The method includes depositing a first work function metal on the multivalent oxide layer of the first transistor area and directly on the high-k dielectric layer of the second transistor area.

13 Claims, 8 Drawing Sheets

MULTIVALENT OXIDE CAP FOR MULTIPLE WORK FUNCTION GATE STACKS ON HIGH MOBILITY CHANNEL MATERIALS

BACKGROUND

The present invention generally relates to fabrication methods and resulting structures for semiconductor devices. More specifically, the present invention relates to multivalent oxide caps for multiple work function gate stacks on high mobility channel materials.

In an integrated circuit, each metal oxide semiconductor field effect transistor (MOSFET) has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

SUMMARY

Embodiments of the present invention are directed to a method for fabricating a semiconductor device. A non-limiting example of the method includes providing a high-k dielectric layer arranged on a channel region including a first transistor area and a second transistor area. The method further includes depositing a multivalent oxide layer directly on the high-k dielectric layer of the first transistor area. The method includes depositing a first work function metal on the multivalent oxide layer of the first transistor area and directly on the high-k dielectric layer of the second transistor area.

Another non-limiting example of the method includes providing a high-k dielectric layer arranged on a channel region including a first transistor area, a second transistor area, a third transistor area, and a fourth transistor area. The method includes depositing a multivalent oxide layer directly on the high-k dielectric layer of the first transistor area and the third transistor area. The method further includes depositing a first work function metal on the multivalent oxide layer of the first transistor area and the third transistor area and directly on the high-k dielectric layer of the second transistor area and the fourth transistor area. The method includes removing the first work function metal from the first transistor area and the second transistor area. The method further includes depositing a second work function metal on the first transistor area, the second transistor area, the third transistor area, and the fourth transistor area.

Embodiments of the present invention are directed to a semiconductor device. A non-limiting example of the semiconductor device includes a channel region including a first transistor area and a second transistor area and a high-k dielectric layer arranged on the channel region. The semiconductor device includes a multivalent oxide layer arranged directly on the high-k dielectric layer of the first transistor area. The semiconductor device further includes a first work function metal arranged on the multivalent oxide layer of the first transistor area and directly on the high-k dielectric layer of the second transistor area.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1-8 depict a process flow for forming a semiconductor device including gate stacks with multiple work functions according to embodiments of the invention, in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, planar transistor devices include doped channel architectures, while other types of transistors (e.g., FinFET devices and nanosheet devices) include a fully depleted channel. Compared to planar devices, fully depleted channels have higher channel mobility and provide smaller device variability.

Implementing CMOS technology with different threshold voltages can be achieved on fully depleted channels with gate stacks having multiple work functions. However, typical work function schemes to achieve gate stacks with multiple work functions generally use high temperature anneals (e.g., >900° C.) to diffuse dipole formation elements (e.g., La, Al) through high-k dielectrics. Although Si or SiGe having a low Ge content (e.g., <50%) can survive such high temperatures, alternate channel materials with higher mobility (e.g., high Ge content SiGe, carbon nanotubes, 2D materials, and III-V materials) are not compatible with these high temperature conditions.

Turning now to an overview of the aspects of the invention, one or more embodiments of the invention address the above-described shortcomings of the prior art by providing fabrication methods and resulting structure for semiconductor devices with multivalent oxide caps (e.g., CeOx) on high-k dielectric layers. The multivalent oxide layers on the high-k dielectric modify the oxygen chemical potential via oxidation (e.g., $Ce_2O_3 \rightarrow CeO_2$) and reduction ($CeO_2 \rightarrow Ce_2O_3$) reactions to provide a high threshold voltage ($V_t$) in both nFET and pFET devices. The multivalent oxide caps are not included on the regular nFET and pFET transistors, which provides gate stacks with both high and low threshold voltages on the same substrate.

The above-described aspects of the invention address the shortcomings of the prior art by providing fabrication methods and resulting structures for semiconductor devices with multiple work function gate stacks and high mobility channel materials that generally cannot withstand high annealing temperatures.

Figure 1:
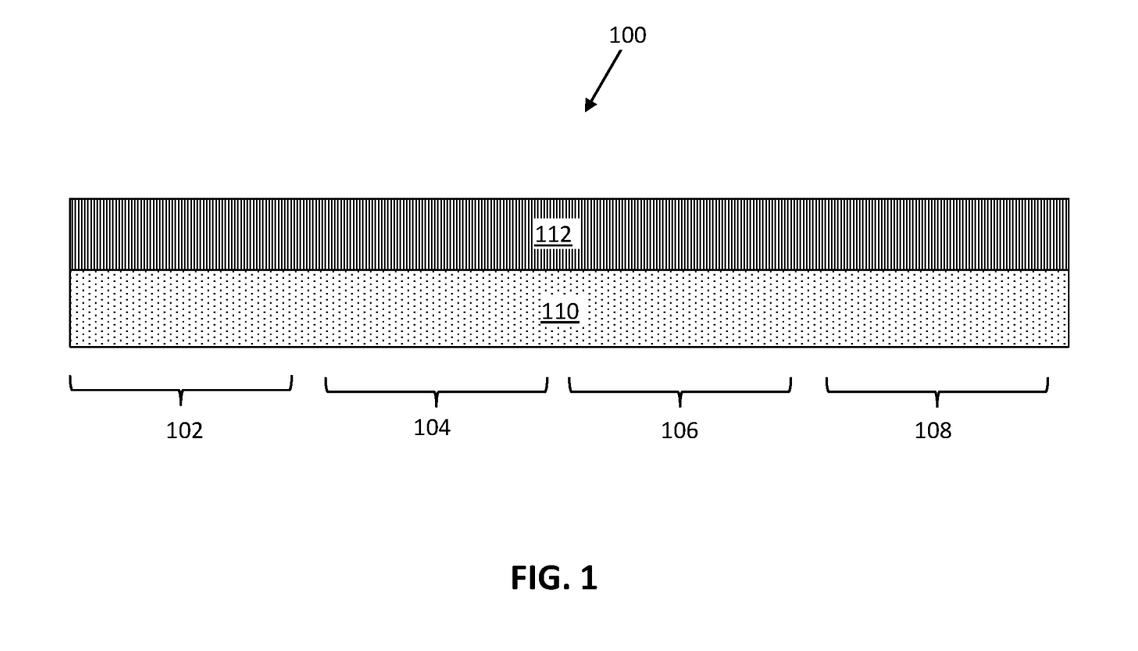
FIG. 1 depicts a cross-sectional side view of a semiconductor device including a high-k dielectric layer arranged on a channel region having four transistor device areas.

Turning now to a more detailed description of aspects of the present invention, FIGS. 1-8 depict a process flow for forming a semiconductor device including gate stacks with multiple work functions according to embodiments of the invention. FIG. 1 depicts a cross-sectional side view of a semiconductor device 100 including a high-k dielectric layer on channels of four transistor devices on a common channel 110 region. The channel 110 region includes one or more semiconductor materials including, but not limited to, high Ge content (>50%) SiGe, Ge, Ge alloys, carbon nanotubes, 2D materials, III-V materials (e.g., GaAs, InAs, InP, and AlAs), or any combination thereof. Other non-limiting examples of III-V materials include materials with at least one "III element," such as aluminum (Al), boron (B), gallium (Ga), indium (In), and at least one "V element," such as nitrogen (N), phosphorous (P), arsenic (As), antimony (Sb). The channel 110 can include any suitable channel material that cannot tolerate high processing temperatures (e.g., >400° C.).

A high-k dielectric layer 112 is a gate dielectric layer formed on the channel 110. The high-k dielectric layer 112 includes a dielectric constant (k) that is greater than 3.9 in some embodiments of the invention, greater than 4.0 in other embodiments of the invention, and greater than 7.9 in yet other embodiments of the invention. The high-k dielectric layer 112 can include, but is not limited to, hafnium (Hf) based dielectric materials (e.g., hafnium oxide, hafnium silicon oxide, hafnium silicon oxynitride) and zirconium (Zr) based dielectric materials (e.g., zirconium oxide, zirconium silicon oxide, zirconium silicon oxynitride), or a combination thereof. The high-k dielectric layer 112 is formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes.

The channel 110 and high-k dielectric layer 112 are divided into different transistor device areas. First transistor 102 and second transistor 104 include a same (first) channel type (e.g., n-type or p-type). According to one or more embodiments of the invention, first transistor 102 is a first nFET device, and second transistor 104 is a second nFET device. First transistor 102 and second transistor 104 will be formed to have different threshold voltages, with first transistor 102 having a higher threshold voltage than second transistor 104. Third transistor 106 and fourth transistor 108 include a same (second) channel type (e.g., n-type of p-type), which is different than the first channel type of the first and second transistor 102, 104. Third transistor 106 is a first pFET device, and fourth transistor 108 is a second pFET device. Third transistor 106 and fourth transistor 108 will be formed with different threshold voltages, with third transistor 106 having a higher threshold voltage than fourth transistor 108. Although four adjacent transistors are depicted for illustration purpose, the semiconductor device 100 can include any number of transistor device areas with any combinations in actual circuits.

Figure 2:
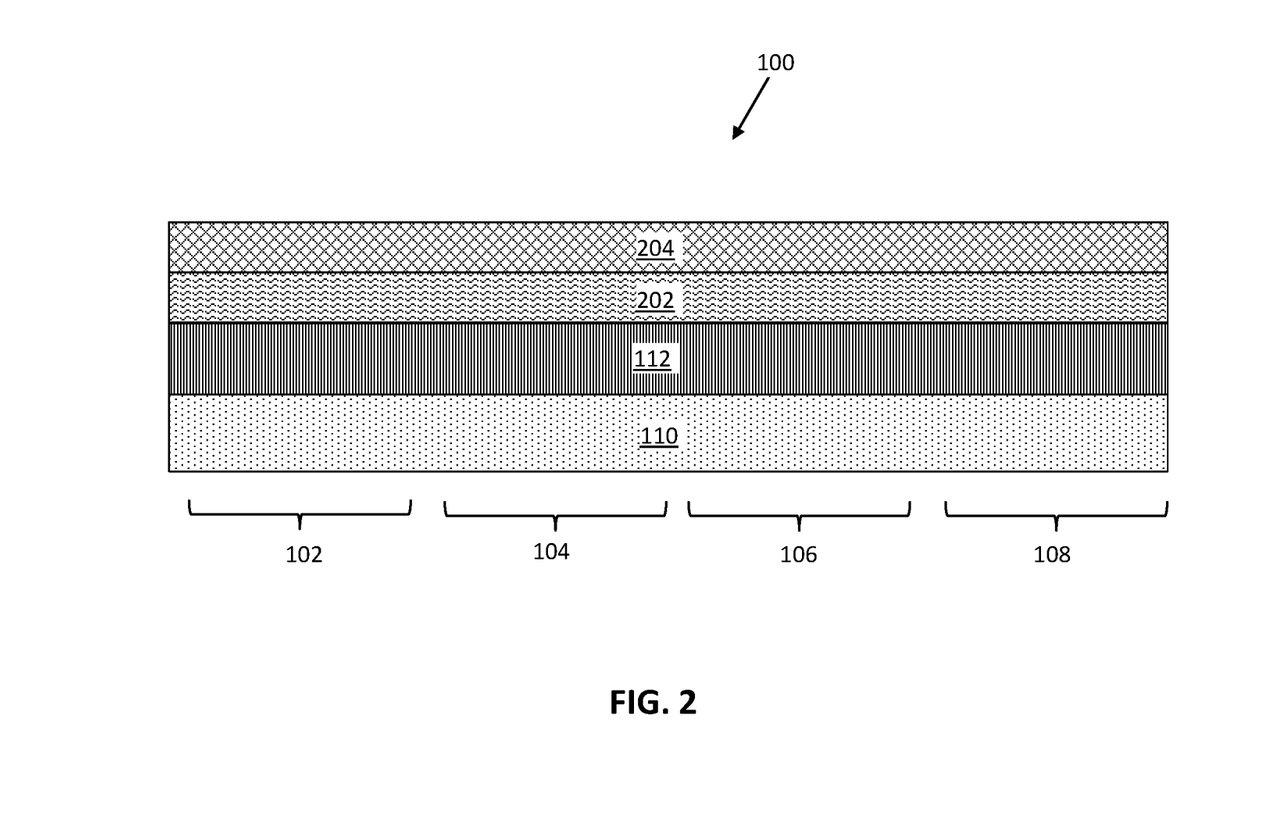
FIG. 2 depicts a cross-sectional side view of the semiconductor device subsequent to depositing a multivalent oxide layer and a diffusion barrier layer on the high-k dielectric layer.

FIG. 2 depicts a cross-sectional side view of the semiconductor device 100 subsequent to depositing a multivalent oxide layer 202 and a diffusion barrier layer 204 (first diffusion barrier layer) on the high-k dielectric layer 112. The multivalent oxide layer 202 and the diffusion barrier layer 204 are formed as blanket layers on the high-k dielectric layer 112 of first, second, third, and fourth transistors 102, 104, 106, 108. The multivalent oxide layer 202 is formed directly on the high-k dielectric layer 112. The multivalent oxide layer 202 are threshold adjustment layers that will remain on one or more transistor devices (see FIG. 3, first transistor 102 and third transistor 106) after being removed from one or more transistor devices (see FIG. 3, second transistor 104 and fourth transistor 108).

The multivalent oxide layer 202 includes a multivalent transition metal cation and oxygen to form a multivalent transition metal oxide compound. The multivalent transition metal cation can be, but is not limited to, vanadium (V), tin (Sn), caesium (Ce), praseodymium (Pr), or europium (Eu). Non-limiting examples of multivalent transition metal oxides include vanadium oxide, tin oxide, cerium oxide, praseodymium oxide, and europium oxide. The multivalent oxide layer 202 can be formed by chemical vapor deposition (CVD), physical vapor deposition (PVD), atomic layer deposition (ALD), vacuum evaporation, etc. The thickness of the multivalent oxide layer 202 can be from about 0.05 nm to about 2 nm, and typically from about 0.05 nm to about 1 nm, although lesser and greater thicknesses are also contemplated herein.

The diffusion barrier layer 204 is formed directly on the multivalent oxide layer 202. The diffusion barrier layer 204 includes a metallic nitride material that functions as a diffusion barrier for metals. The diffusion barrier layer 204 includes, but is not limited to, TiN, TaN, WN, or a combination thereof. The diffusion barrier layer 204 can be formed by chemical vapor deposition (CVD), physical vapor deposition (PVD), atomic layer deposition. (ALD), vacuum evaporation, etc. The thickness of the diffusion barrier layer 204 can be from about 1 nm to about 10 nm, and typically from about 2 nm to about 5 nm, although lesser and greater thicknesses are also contemplated herein.

Figure 3:
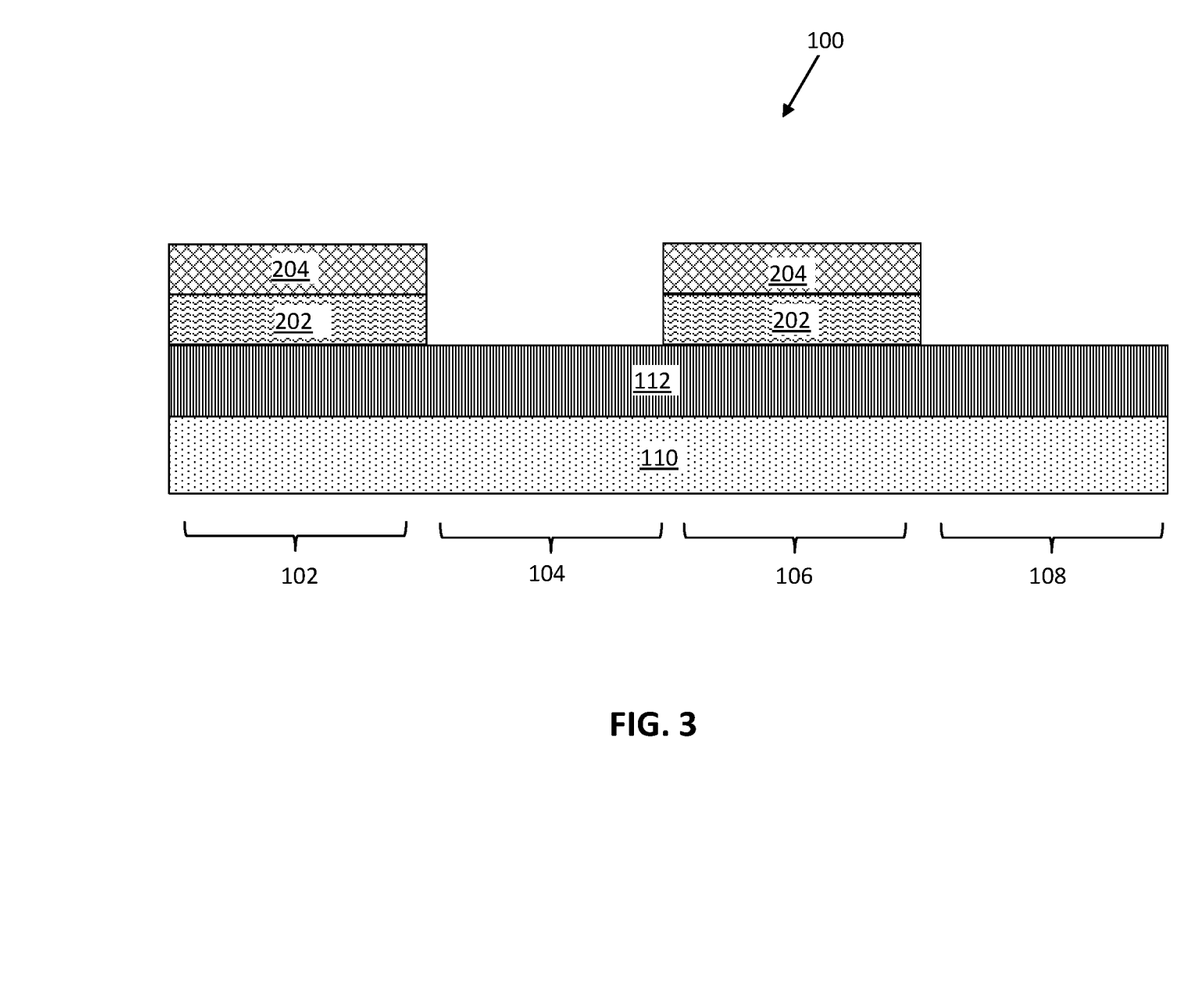
FIG. 3 depicts a cross-sectional side view of the semiconductor device subsequent to patterning the multivalent oxide layer and the diffusion barrier layer.

FIG. 3 depicts a cross-sectional side view of the semiconductor device 100 subsequent to patterning the multivalent oxide layer 202 and the diffusion barrier layer 204. A mask (not shown), for example, a photoresist layer, is applied over the diffusion barrier layer 204 and the multivalent oxide layer 202 and are lithographically patterned by lithographic exposure and development. The mask is patterned to cover at least one transistor area, while physically covering at least another transistor area. The diffusion barrier layer 204 and multivalent oxide layer 202 are then patterned by an etch process that employs the patterned mask as an etch mask. Upon patterning of the diffusion barrier layer 204 and multivalent oxide layer 202, at least one portion of the high-k dielectric layer 112 is physically exposed (second transistor 104 and fourth transistor 108), while at least another portion of the high-k dielectric layer 112 is covered (first transistor 102 and third transistor 106) by a patterned portion of the diffusion barrier layer 204 and the multivalent oxide layer 202.

Without being bound by theory, it is believed that the multivalent oxide layer 202 modifies the oxygen chemical potential via oxidation and reduction reactions with the high-k dielectric layer 112 in one or more transistor areas (first transistor 102 and third transistor 106). Taking cerium oxide as an example, the following oxidation reaction and reduction reactions can occur: $Ce_2O_3 \rightarrow CeO_2$ (oxidation); $CeO_2 \rightarrow Ce_2O_3$ (reduction). Different reactions (oxidation or reduction) are believed to occur in the different transistors (first transistor 102 and third transistor 106) with the same multivalent oxide layer 202 on the same high-k dielectric layer 112 due to differences in oxygen vacancy ($V_o$) concentrations in the different devices. For example, when first transistor 102 is a nFET, and third transistor 106 is a pFET, a $V_o$ reduction in the high-k dielectric layer 112 of the nFET will occur via reduction of the multivalent oxide ($CeO_2 \rightarrow Ce_2O_3$), which results in a high threshold voltage ($V_t$) in the nFET (first transistor 102). Conversely, a $V_o$ increase in the high-k dielectric layer 112 of the pFET will occur via oxidation of the multivalent oxide ($Ce_2O_3 \rightarrow CeO_2$), which results in a high threshold voltage ($V_t$) in the pFET (third transistor 106). Because these oxidation-reduction reactions occur when arranged on the high-k dielectric layer 112, it is not necessary to drive the multivalent oxide layer 202 material through the high-k dielectric layer 112, which means that high temperature anneals do not need to be performed.

Figure 4:
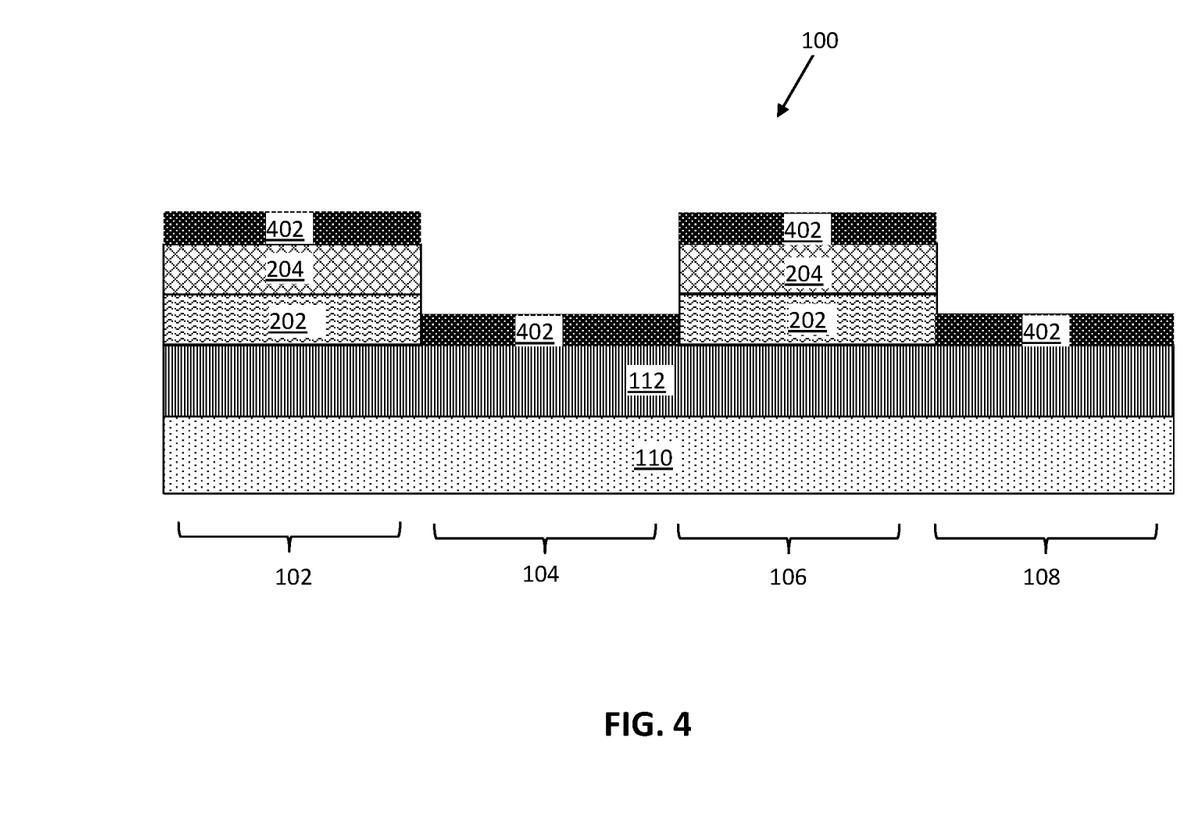
FIG. 4 depicts a cross-sectional side view of the semiconductor device subsequent to depositing another diffusion barrier layer.

FIG. 4 depicts a cross-sectional side view of the semiconductor device 100 subsequent to depositing another diffusion barrier layer 402 (second diffusion barrier layer). The diffusion barrier layer 402 is formed as a blanket layer on all transistor areas (first transistor 102, second transistor 104, third transistor 106 and fourth transistor 108). In the first transistor 102 area and the third transistor 1106 area, the diffusion barrier layer 402 is formed directly on the multivalent oxide layer 204. In the second transistor 104 area and the fourth transistor 402 area, the diffusion barrier layer 402 is formed directly on the high-k dielectric layer 112. The diffusion barrier layer 402 includes a metallic nitride material that functions as a diffusion barrier for metals. The diffusion barrier layer 402 includes, but is not limited to, TaN. The diffusion barrier layer 402 can be formed by chemical vapor deposition (CVD), physical vapor deposition (PVD), atomic layer deposition (ALD), vacuum evaporation, etc. The thickness of the diffusion barrier layer 402 can be from about 1 nm to about 10 nm, and typically from about 2 nm to about 5 nm, although lesser and greater thicknesses are also contemplated herein.

Figure 5:
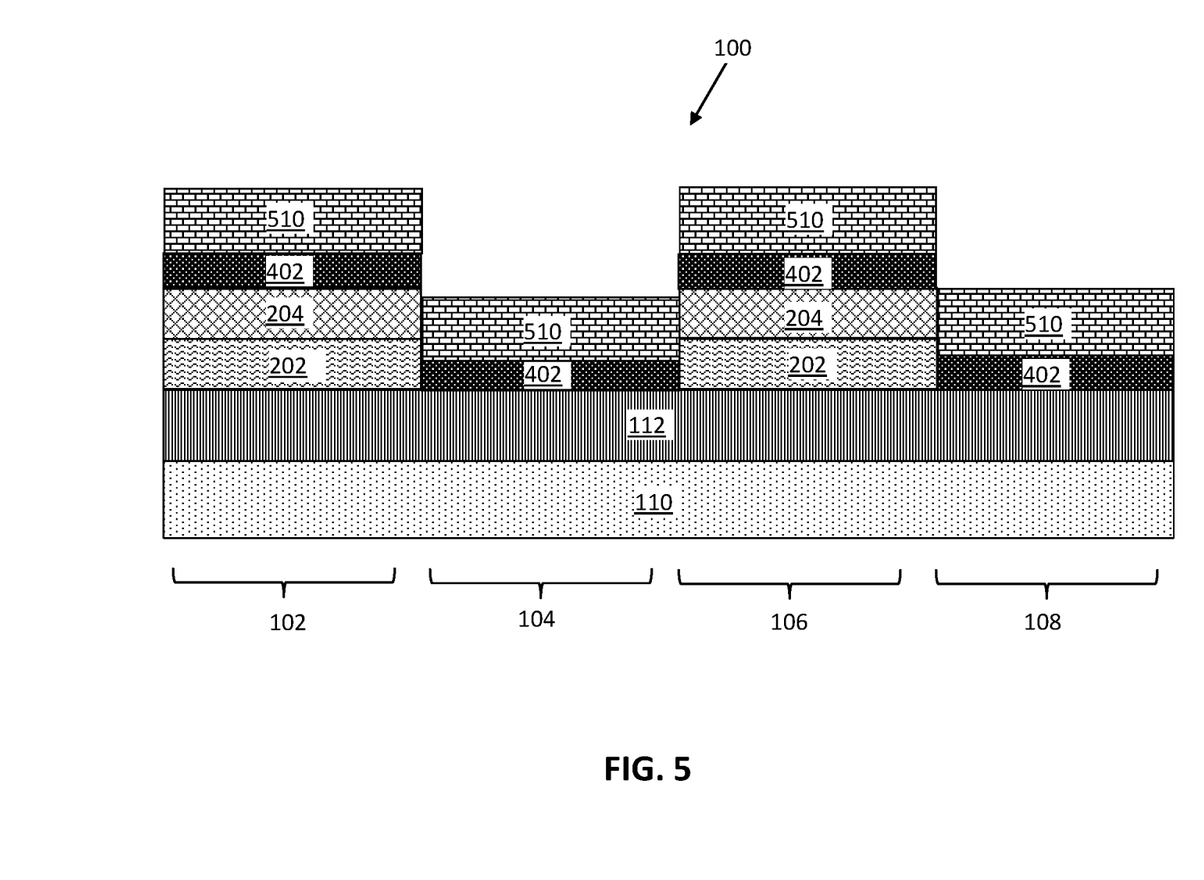
FIG. 5 depicts a cross-sectional side view of the semiconductor device subsequent to depositing a p-type work function on the diffusion barrier layer.

FIG. 5 depicts a cross-sectional side view of the semiconductor device 100 subsequent to depositing a first work function metal 510 on the diffusion barrier layer 402. The first work function setting metal 510 is a first work function setting metal layer with a first work function (e.g., n-type or p-type). According to one or more embodiments of the invention, the first work function setting metal 510 is a p-type work function setting metal and includes an element only, or a metallic compound that includes a metal and a non-metal element. The first work function setting metal 510 is formed as a blanket layer on all transistor areas (first transistor 102, second transistor 104, third transistor 106, and fourth transistor 108) and directly on the diffusion barrier layer 402. The first work function setting metal 510 is deposited directly on the high-k dielectric layer 112 of the second transistor 104 and the fourth transistor 108. When the first work function setting metal 510 is a p-type work function metal, the first work function setting metal 510 includes, but is not limited to, TiN. The first work function setting metal 510 can be formed by chemical vapor deposition (CVD), physical vapor deposition (PVD), atomic layer deposition (ALD), vacuum evaporation, etc. The thickness of the first work function metal 510 can be from about 2 nm to about 10 nm, and typically from about 3 nm to about 5 nm, although lesser and greater thicknesses are also contemplated herein.

Figure 6:
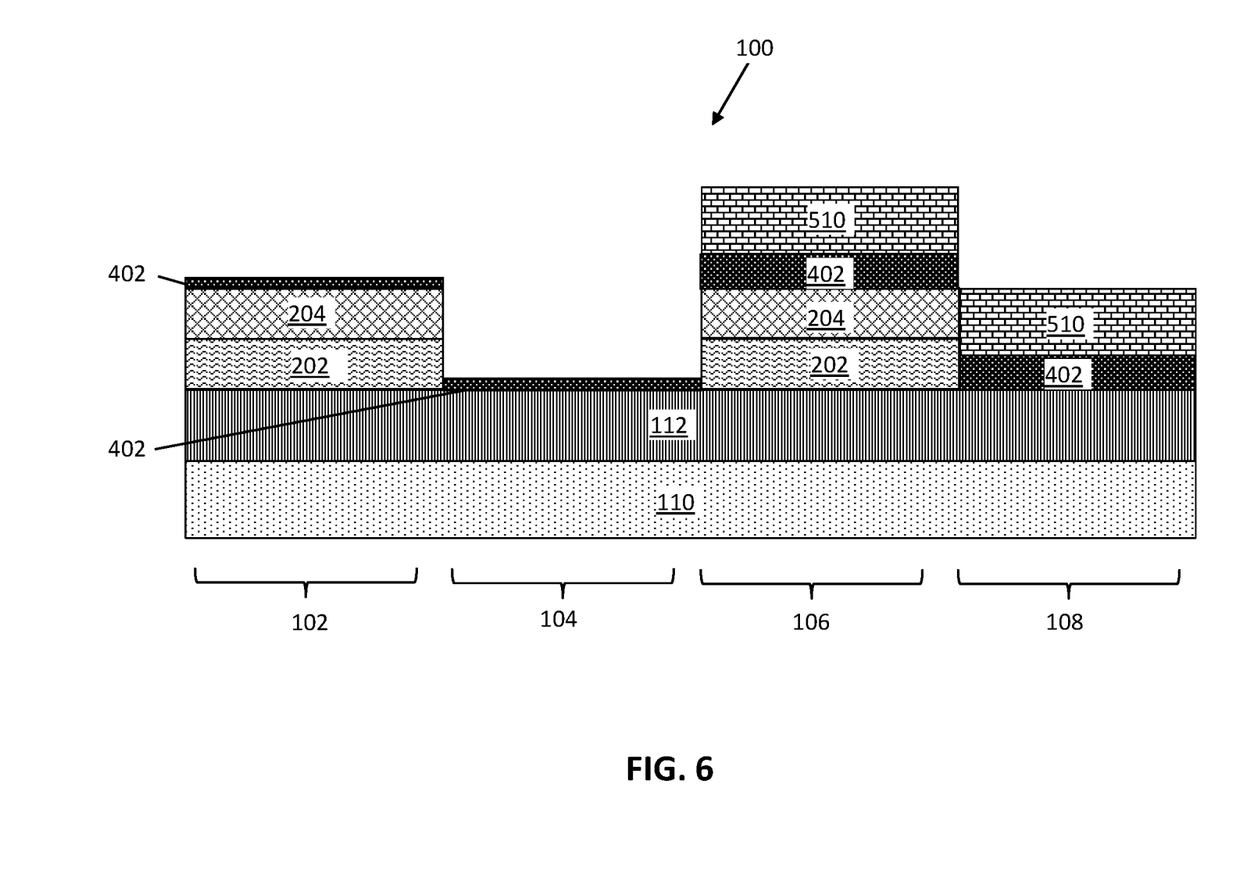
FIG. 6 depicts a cross-sectional side view of the semiconductor device subsequent to patterning the diffusion barrier layer and the p-type work function metal.

FIG. 6 depicts a cross-sectional side view of the semiconductor device 100 subsequent to patterning the diffusion barrier layer 402 and the first work function setting metal 510. A mask (e.g., photoresist) (not shown) is applied and lithographically patterned so that the mask covers the area over the device regions in which third transistor 106 and fourth transistor 108 (with the same channel type) are present, while the top surface of the first work function setting metal 510 is exposed over the device regions in which second type of channel regions (first transistor 102 and second transistor 104) are present. The pattern in the mask is transferred into the first work function setting metal 510 and diffusion barrier layer 402 by an etch. The p-type work function setting metal 510 is removed from the first transistor 102 and second transistor 104. The mask is removed, for example, by ashing or wet etching. After the patterning of the first work function setting metal 510, a portion of the diffusion barrier layer 402 can remain present, although some can be removed, in the first transistor 102 and second transistor 104 areas.

Figure 7:
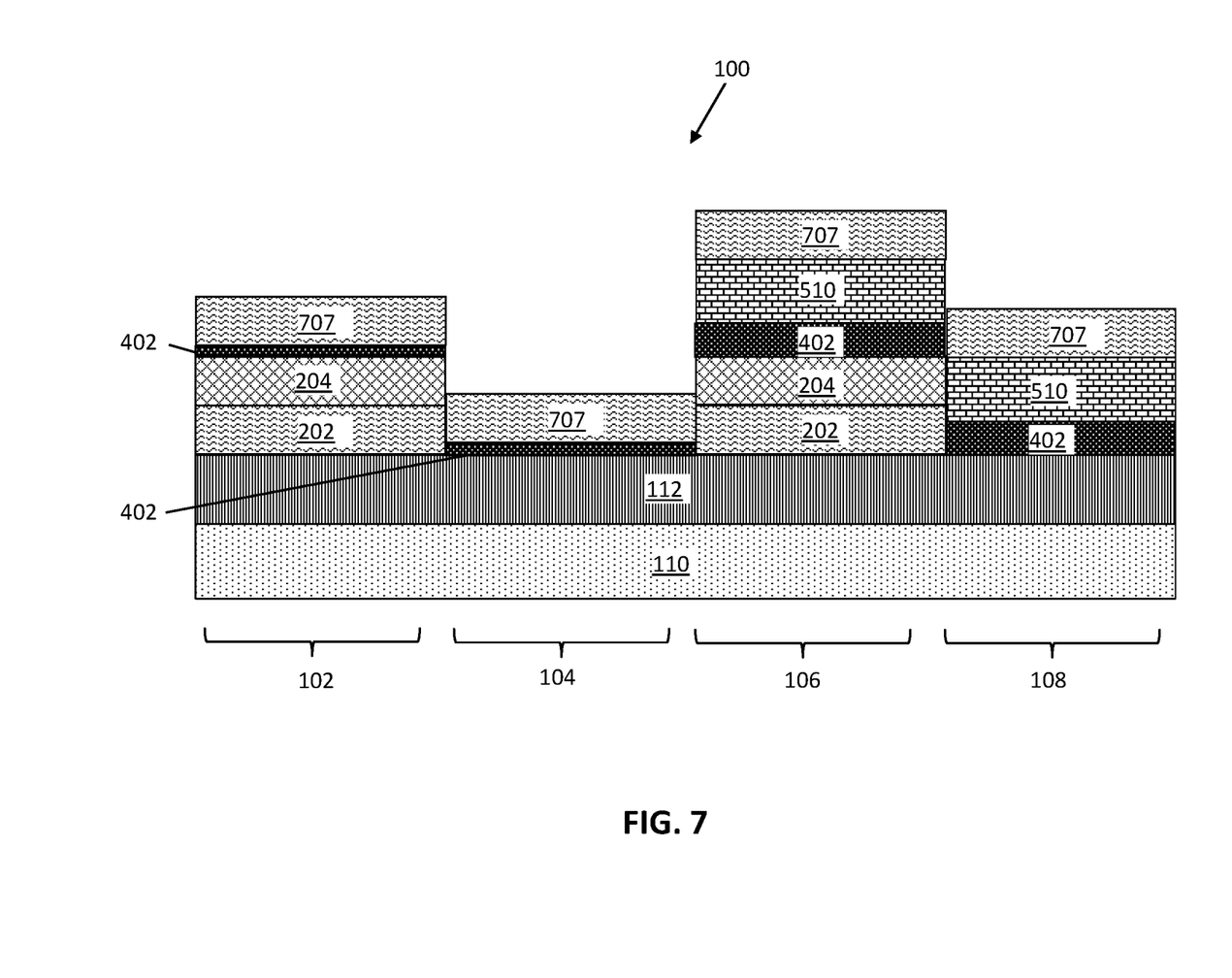
FIG. 7 depicts a cross-sectional side view of the semiconductor device subsequent to depositing an n-type work function metal.

FIG. 7 depicts a cross-sectional side view of the semiconductor device 100 subsequent to depositing a second work function setting metal 707. The second work function setting metal 707 is a different type than the first work function setting metal 510. According to one or more embodiments, the second work function setting metal 707 is an n-type and can include an element only, or a metallic compound that includes one or more metals and one or more non-metal elements. The second work function setting metal 707 is formed as a blanket layer on all transistor areas (first transistor 102, second transistor 104, third transistor 106, and fourth transistor 108). In the first transistor 102 and second transistor 104, which have the same channel type, the second work function setting metal 707 is formed directly on remaining portions of the diffusion barrier layer 402. In the third transistor 106 and fourth transistor 108, which have the same channel type, the second work function setting metal 707 is formed directly on the first work function setting metal 510. The second work function setting metal 707 includes, but is not limited to, an aluminum containing alloy, including for example, TiAlC, TiAl, TaAlC, TaAl, or a combination thereof. The second work function metal 707 can be formed by chemical vapor deposition (CVD), physical vapor deposition (PVD), atomic layer deposition (ALD), vacuum evaporation, etc. The thickness of the second work function metal 707 can be from about 2 nm to about 10 nm, and typically from about 3 nm to about 5 nm, although lesser and greater thicknesses are also contemplated herein.

Figure 8:
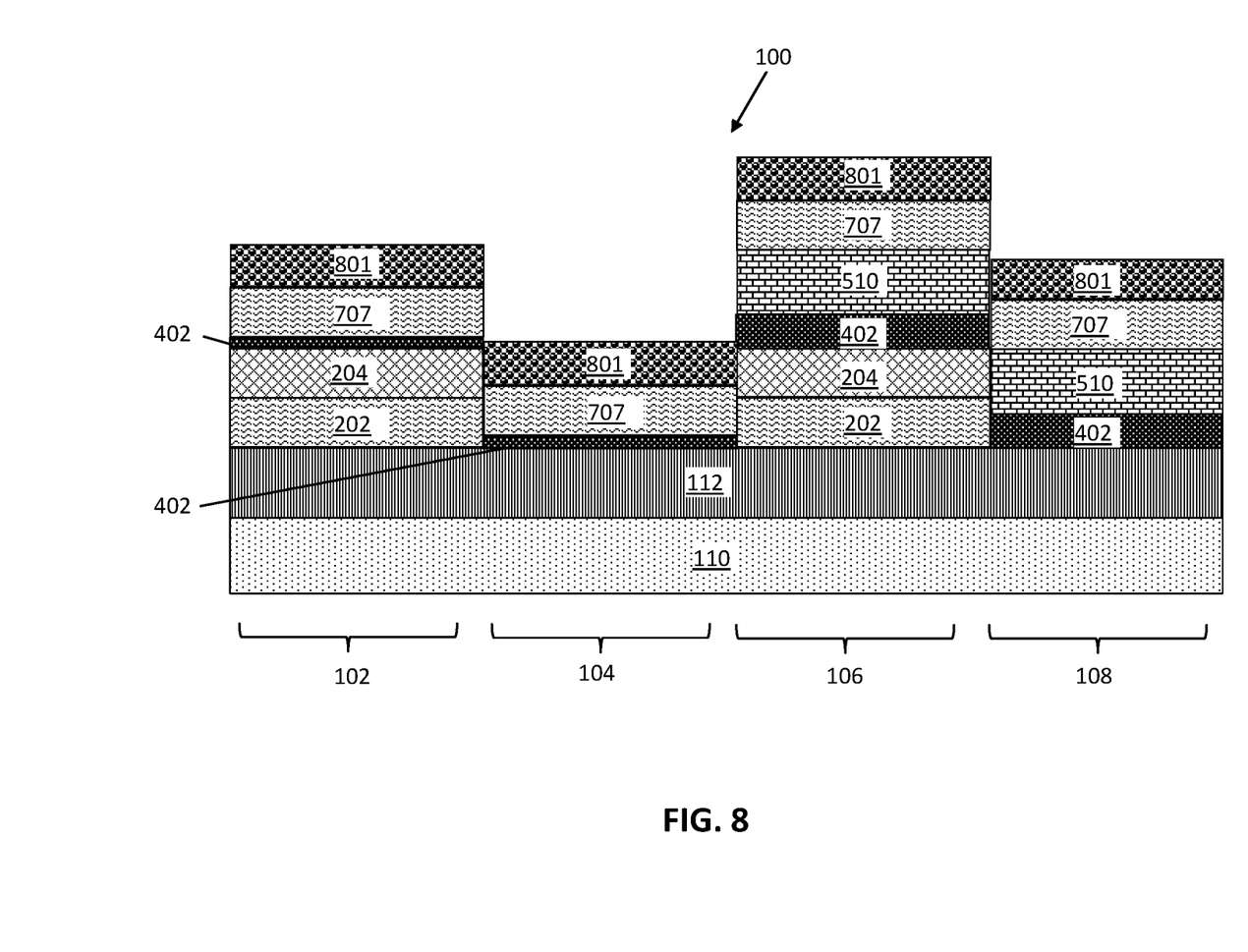
FIG. 8 depicts a cross-sectional side view of the semiconductor device subsequent to depositing a diffusion barrier layer on the n-type work function metal.

FIG. 8 depicts a cross-sectional side view of the semiconductor device 100 subsequent to depositing a third diffusion barrier layer 801 on the second work function metal 707. The third diffusion barrier layer 801 is formed as a blanket layer on all transistor areas (first transistor 102, second transistor 104, third transistor 106, and fourth transistor 801). The third diffusion barrier layer 801 includes a metallic nitride material that functions as a diffusion barrier for metals. The third diffusion barrier layer 801 includes, but is not limited to, TiN, TaN, WN, or a combination thereof. The third diffusion barrier layer 801 can be formed by chemical vapor deposition (CVD), physical vapor deposition (PVD), atomic layer deposition (ALD), vacuum evaporation, etc. The thickness of the third diffusion barrier layer 801 can be from about 1 nm to about 10 nm, and typically from about 1 nm to about 5 nm, although lesser and greater thicknesses are also contemplated herein.

According to one or more embodiments of the invention, an additional conductive material layer (not shown) can be deposited on the third diffusion barrier layer 801. The additional conductive material layer can include, for example, a doped semiconductor material layer and/or a metallic material layer, for example, aluminum (Al), cobalt (Co), platinum (Pt), gold (Au), tungsten (W), titanium (Ti), cobalt (Co), or any combination thereof. Gate stacks for each transistor are formed by a planarization process, for example, a chemical mechanical planarization (CMP). The device can then be further processed using known process flows.

The above process flow provides transistors with gate stacks having both high and low threshold voltages. Although first transistor 102 and second transistor 104 have the same channel type n-type), the multivalent oxide layer 202 arranged on the same high-k dielectric layer 112 provides a higher threshold voltage. Similarly, third transistor 106 and fourth transistor 108 also have the same channel type (e.g., p-type), yet the multivalent oxide layer 202 provides a higher threshold voltage. Thus both high and low threshold voltage devices can be formed on the same substrate. The process flow described above is applicable to any 3D transistor structures, including, but not limited to, FinFET devices, nanosheet devices, nanowire devices, and vertical FET devices.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
   providing a high-k dielectric layer arranged on a channel region comprising a first transistor area and a second transistor area;
   depositing a multivalent oxide layer directly on the high-k dielectric layer of the first transistor area, the multivalent oxide layer being vanadium oxide, tin oxide, cerium oxide, praseodymium oxide, europium oxide, or a combination thereof; and
   depositing a first work function metal on the multivalent oxide layer of the first transistor area and directly on the high-k dielectric layer of the second transistor area.

2. The method of claim 1 further comprising, prior to depositing the first work function metal, depositing a diffusion barrier layer directly on the multivalent oxide layer.

3. The method of claim 2 further comprising, prior to depositing the first work function metal, removing the multivalent oxide layer and the diffusion barrier layer from the second transistor area.

4. The method of claim 1, wherein the first work function metal comprises a p-type work function metal.

5. The method of claim 4, wherein the p-type work function metal comprises TiN, W, or a combination thereof.

6. A method of fabricating a semiconductor device, the method comprising:
   providing a high-k dielectric layer arranged on a channel region comprising a first transistor area, a second transistor area, a third transistor area, and a fourth transistor area;
   depositing a multivalent oxide layer directly on the high-k dielectric layer of the first transistor area and the third transistor area;
   depositing a first work function metal on the multivalent oxide layer of the first transistor area and the third transistor area and directly on the high-k dielectric layer of the second transistor area and the fourth transistor area;
   removing the first work function metal from the first transistor area and the second transistor area; and
   depositing a second work function metal on the first transistor area, the second transistor area, the third transistor area, and the fourth transistor area.

7. The method of claim 6, wherein the multivalent oxide layer comprises vanadium oxide, tin oxide, cerium oxide, praseodymium oxide, europium oxide, or a combination thereof.

8. The method of claim 6, wherein the channel region of the first transistor area and the second transistor area comprise a first channel type, and the channel region of the third transistor area and the fourth transistor area are a second channel type that is different than the first channel type.

9. The method of claim 6 further comprising, prior to depositing the first work function metal, depositing a diffusion barrier layer directly on the multivalent oxide layer.

10. The method of claim 9 further comprising, prior to depositing the first work function metal, removing the multivalent oxide layer and the diffusion barrier layer from the second transistor area.

11. The method of claim 6, wherein the first work function metal comprises a p-type work function metal, and the second work function metal comprises an n-type work function metal.

12. The method of claim 11, wherein the p-type work function metal comprises TiN, W, or a combination thereof, and the n-type work function metal comprises an aluminum alloy.

13. A method of fabricating a semiconductor device, the method comprising:

providing a high-k dielectric layer arranged on a channel region comprising a first transistor area and a second transistor area, the channel region of the first transistor area and the second transistor area comprising a same channel type;

depositing a multivalent oxide layer directly on the high-k dielectric layer of the first transistor area; and depositing a first work function metal on the multivalent oxide layer of the first transistor area and directly on the high-k dielectric layer of the second transistor area.

* * * * *